(12) United States Patent
Chen

(10) Patent No.: US 12,713,809 B2
(45) Date of Patent: Aug. 18, 2026

(54) DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Huan Chen, Wuhan (CN)

( * ) Notice: Subject to any disclaimer, the term of this patent is extended or adjusted under 35 U.S.C. 154(b) by 1086 days.

(21) Appl. No.: 17/789,813

(22) PCT Filed: Jun. 27, 2022

(86) PCT No.: PCT/CN2022/101437

§ 371 (c)(1),
(2) Date: Nov. 30, 2023

(87) PCT Pub. No.: WO2023/226138

PCT Pub. Date: Nov. 30, 2023

(65) Prior Publication Data

US 2024/0179996 A1 May 30, 2024

(30) Foreign Application Priority Data

May 25, 2022 (CN) ........................ 202210578668.9

(51) Int. Cl.
*H10K 59/80* (2023.01)
*H10K 59/124* (2023.01)

(52) U.S. Cl.
CPC ..... *H10K 59/80517* (2023.02); *H10K 59/124* (2023.02)

(58) Field of Classification Search
CPC ............... H10K 59/123; H10K 59/124; H10K 59/8051; H10K 59/80517; H10K 59/80518; H10K 50/80–818; H10K 50/84; H10K 50/844
See application file for complete search history.

(56) References Cited

U.S. PATENT DOCUMENTS

2019/0348624 A1* 11/2019 Kim .................... H10K 59/124
2022/0037612 A1 2/2022 Lou et al.

FOREIGN PATENT DOCUMENTS

CN 101819988 A 9/2010
CN 103137800 A 6/2013
CN 104091894 A 10/2014
CN 109904211 A 6/2019
(Continued)

OTHER PUBLICATIONS

Chinese Office Action issued in corresponding Chinese Patent Application No. 202210578668.9 dated May 1, 2025, pp. 1-7.
(Continued)

*Primary Examiner* — Thanhha S Pham

(57) ABSTRACT

A display panel is provided, including: a substrate; a first planarization layer disposed on a side of the substrate, wherein a first via hole is defined in the first planarization layer; a first ITO layer disposed on a side of the first planarization layer away from the substrate; and an anode disposed on a side of the first ITO layer away from the first planarization layer. Wherein, a first groove is defined in the first ITO layer to make a part of the anode be disposed in the first groove, and a projection of the first groove on the substrate at least partially overlaps with a projection of the first via hole on the substrate.

20 Claims, 3 Drawing Sheets

(56) References Cited

FOREIGN PATENT DOCUMENTS

| | | | |
|---|---|---|---|
| CN | 111554634 | A | 8/2020 |
| CN | 111886699 | A | 11/2020 |
| CN | 112259579 | A | 1/2021 |
| CN | 112965310 | A | 6/2021 |
| CN | 113745272 | A | 12/2021 |
| CN | 114464656 | A | 5/2022 |

OTHER PUBLICATIONS

International Search Report in International application No. PCT/CN2022/101437, mailed on Dec. 12, 2022.

Written Opinion of the International Search Authority in International application No. PCT/CN2022/101437, mailed on Dec. 12, 2022.

* cited by examiner

DISPLAY PANEL

BACKGROUND OF INVENTION

Field of Invention

The present application relates to a display field, and particularly to a display panel.

Description of Prior Art

Compared to liquid crystal displays (LCDs), organic light-emitting diode (OLED) displays have advantages of thinness, lightness, wide viewing angles, active light-emitting, continuously adjustable light-emitting colors, fast response speed, low power consumption, low driving voltages, high luminous efficiency, and flexible display, etc., which receive great attention from the industries and the scientific communities.

However, via holes need to be defined in planarization layers of current OLED display panel during manufacturing processes, and the via holes are easy to cause unevenness to deposited metal film layers, thereby causing fractures due to uneven stress distribution during manufacturing processes of anodes.

SUMMARY OF INVENTION

Embodiments of the present application provide a display panel, which can remedy the problem that fractures generate in the OLED display panels during manufacturing the anodes.

One embodiment of the present application provides a display panel. The display panel includes:

a substrate;

a first planarization layer, wherein the first planarization layer is disposed on a side of the substrate, and a first via hole is defined in the first planarization layer;

a first indium tin oxide (ITO) layer, wherein the first ITO layer is disposed on a side of the first planarization layer away from the substrate;

an anode, wherein the anode is disposed on a side of the first ITO layer away from the first planarization layer; and wherein a first groove is defined in the first ITO layer to make a part of the anode be disposed in the first groove, and a projection of the first groove on the substrate at least partially overlaps with a projection of the first via hole on the substrate.

The present application provides a display panel. The display panel includes a substrate and a first planarization layer, a first ITO layer, and an anode sequentially disposed on a side of the substrate. Wherein, a first via hole is defined in the first planarization layer. A first groove is defined in the first ITO layer to make a part of the anode be disposed in the first groove, and a projection of the first groove on the substrate at least partially overlaps with a projection of the first via hole on the substrate. In the embodiments of the present application, by defining the first groove in the first ITO layer to make the anode be partially disposed in the first groove, a situation of protruding anode is relieved. Furthermore, as the projections of the first groove and the first via hole on the substrate are at least partially overlapped, the problem of fracturing anode incurred by excessive impact force during cleaning due to unevenness of the first via hole is remedied better, and crack propagation is reduced, so that the pixel unit will not have display problems.

DETAILED DESCRIPTION OF EMBODIMENTS

The technical solutions in the embodiments of the present application are clearly and completely described in the following with reference to the accompanying drawings in the embodiments of the present application. Obviously, the described embodiments are only part of the embodiments of the present application, but are not all embodiments of the present application. All other embodiments obtained by those skilled in the art based on the embodiments of the present application without creative efforts are within the scope of the present application.

In the description of the present application, it is to be understood that the orientation or positional relationship indicated by the terms "center", "longitudinal", "transverse", "length", "width", "thickness", "upper", "lower", "front", "rear", "left", "right", "vertical", "horizontal", "top", "bottom", "inside", "outside", "clockwise", "counter-clockwise" etc. is based on the orientation or positional relationship shown in the accompanying figures, which is merely for the convenience for describing of the present application and for the simplification of the description, and is not intended to indicate or imply that the indicated devices or elements have a specific orientation or is constructed and operated in a specific orientation. Therefore, it should not be understood as a limitation on the present application. Moreover, the terms first and second are used for descriptive purposes only and are not to be understood as indicating or implying relative importance or implicitly indicating the number of the indicated technical characteristics. Therefore, the characteristics defined by "first" or "second" may include one or more of the described characteristics either explicitly or implicitly. In the description of the present application, the meaning of "a plurality" is two or more unless clearly and specifically defined otherwise.

Via holes need to be defined in planarization layers of current OLED display panel during manufacturing processes. However, the via holes are easy to cause unevenness to deposited metal film layers, so protrusion is generated. Furthermore, wirings of indium tin oxide (ITO) layers under anodes are too thin, so uneven stress distribution incurred by impact force during cleaning processes can lead to fragmentation on the ITO layer and anode layers, and also lead to fragmentation of the anodes.

Therefore, in order to solve the aforesaid problem, the present application provides a display panel. The present application will be further described in detail below in combination with the drawings and embodiments.

Figure 1:
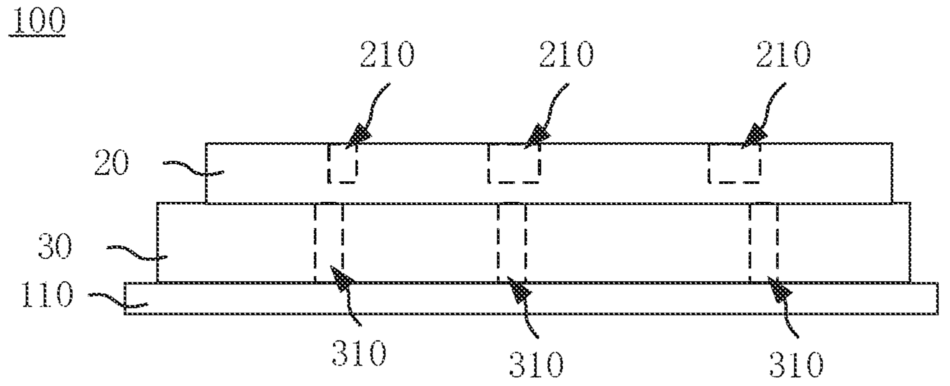
FIG. 1 is a first structural schematic diagram of a display panel provided by one embodiment of the present application.

Please refer to FIG. 1. FIG. 1 is a first structural schematic diagram of a display panel provided by one embodiment of the present application. One embodiment of the present application further provides a display panel 100. The display panel 100 includes a substrate 110, a first planarization layer 30, a first indium tin oxide (ITO) layer 20, and an anode 10. The first planarization layer 30 is disposed on a side of the substrate 110. A first via hole 310 is defined in the first planarization layer 30. The first ITO layer 20 is disposed on a side of the first planarization layer 30 away from the substrate 110. The anode 10 is disposed on a side of the first ITO layer 20 away from the first planarization layer 30. Wherein, a first groove 210 is defined in the first ITO layer 20 to make a part of the anode 10 be disposed in the first groove 210, and a projection of the first groove 210 on the substrate 110 at least partially overlaps with a projection of the first via hole 310 on the substrate 110.

It can be understood that a protrusion appears in the current anode 10 from the reason that after the first via hole 310 is defined in the first planarization layer 30, a part of a metal can be deposited when other metal film layers are disposed. As a result, protrusion of a later deposited film layer appears at a place corresponding to the first via hole 310, thereby causing the anode 10 to protrude. Therefore, in embodiments of the present application, by defining the first groove 210 in the first ITO layer 20 to make the anode 10 can be partially disposed in the first groove 210, which relieves the situation of the protruding anode 10. Furthermore, as the projections of the first groove 210 and the first via hole 310 on the substrate 110 are at least partially overlapped, the situation that the anode 10 protrudes due to the first via hole 310 is better relieved, and the problem of the anode 10 being fractured during the manufacturing process is also solved.

Wherein, designs of the projections of the first groove 210 and the first via hole 310 on the substrate 110 being at least partially overlapped are different in different embodiments, and the specific is configured according to actual situations. Exemplarily, in some embodiments, a projection area of the first groove 210 on the substrate 110 can be larger than a projection area of the first via hole 310 on the substrate 110, so that the first groove 210 can completely eliminate existence of protrusions by accommodating a part of the anode 10. In some embodiments, in a situation that the first groove 210 can eliminate the protrusion of the anode 10 is ensured, the projected area of the first groove 210 on the substrate 110 can be configured to completely overlap with the projected area of the first via hole 310 on the substrate 110 to increase a connection area of the first ITO layer 20 and the anode 10. In some other embodiments, when there are not many metal materials deposited on the first via hole 310, i.e., when the protrusion of the anode 10 is not large, in a condition that the first groove 210 can eliminate the protrusion of the anode 10 is ensured, the projected area of the first groove 210 on the substrate 110 can be configured to be smaller than the projected area of the first via hole 310 on the substrate 110 to increase the connection area of the ITO layer 20 and the anode 10.

It can be understood that a groove depth of the first groove 210 is less than a thickness of the first ITO layer 20, i.e., the first groove 210 is a blind hole to prevent the anode 10 from being connected to the first planarization layer 30 through the first groove 210.

Figure 2:
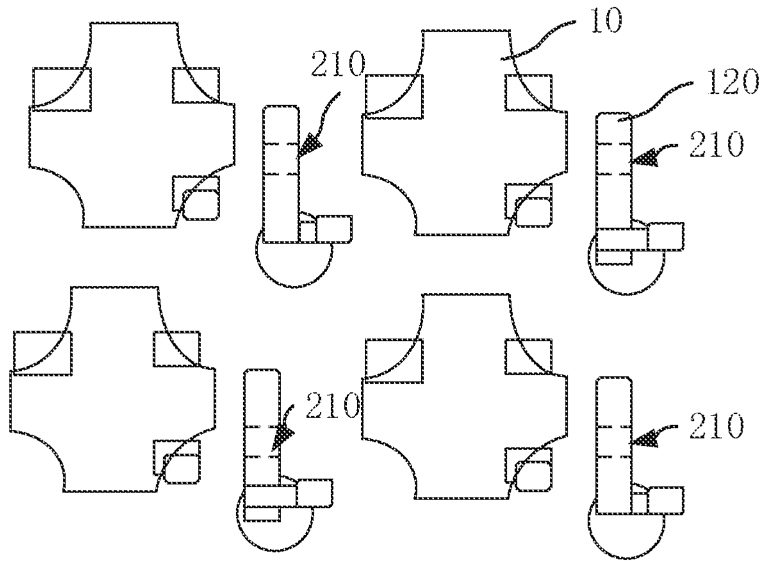
FIG. 2 is a structural schematic diagram of a first groove defined in a first indium tin oxide (ITO) layer in the display panel illustrated in FIG. 1.

Please continue referring to FIG. 2. FIG. 2 is a structural schematic diagram of a first groove defined in a first indium tin oxide (ITO) layer in the display panel illustrated in FIG. 1. In the display panel 100, in order to reduce capacitance between the anode 10 and a driving transistor, the anode 10 is designed with a small tail, and a wiring of the first ITO layer 20 below the small tail 120 of the anode 10 is too thin, which can cause a situation of uneven stress distribution due to impact force during a cleaning process. Therefore, in one embodiment of the present application, the first groove 210 defined in the first ITO layer 20 is at the position corresponding to the small tail 120 of the anode 10. Furthermore, because the first groove 210 and the first via hole 310 are at least partially overlapped, the situation of uneven stress distribution can be relieved, thereby solving the situation of fracture between the anode 10 and the first ITO layer 20.

Specifically, the display panel 100 includes a plurality of pixels and a driving transistor. The pixels are disposed on a side of the anode away from the first planarization layer. The anode 10 includes sub-anodes of smallest sub-pixels in each of the pixels. The sub-anodes include a main body portion and a connection portion, i.e., the small tail 120. Wherein, an orthogonal projection of the main body portion on the substrate is located in an orthogonal projection of the driving transistor on the substrate, and the orthogonal projection of the driving transistor on the substrate is partially located out of an orthogonal projection of the connection portion (small tail 120) on the substrate, i.e., the main body portion of the sub-anode is disposed above the driving transistor, and the connection portion of the sub-anode (the small tail 120) is arranged above a part of the driving transistor. Furthermore, the first groove is defined at a position where the first ITO layer corresponds to the connection portion (the small tail 120).

Wherein, a shape of the connection portion (the small tail 120) can be a regular strip or a regular flake, e.g., a rectangle. The shape of the connection portion (the small tail 120) can also be an irregular shape. The specific can be configured according to actual situations, which is not specifically limited herein.

It should be noted that a sub-pixel with the smallest volume in each pixel can be a sub-pixel with the smallest volume in red, green, and blue sub-pixels, e.g., the green (G) sub-pixel. It can also be the sub-pixel with the smallest volume in red, green, blue, and white sub-pixels, and can also be the sub-pixel with the smallest volume in red, green, blue, and yellow sub-pixels. The specific can be configured according to actual situations, which is not specifically limited herein.

It should be noted that the display panel 100 has a camera under panel (CUP) technology. The display panel 100 with an under-screen camera has a CUP region and a normal display region. An ITO wiring and a planarization (PLN) layer is disposed in the camera under panel region, and the first ITO layer 20 and the anode 10 are disposed in the normal display region, i.e., in the present invention, the first ITO layer 20 provided with the first groove 210 is disposed in the normal display region.

Figure 3:
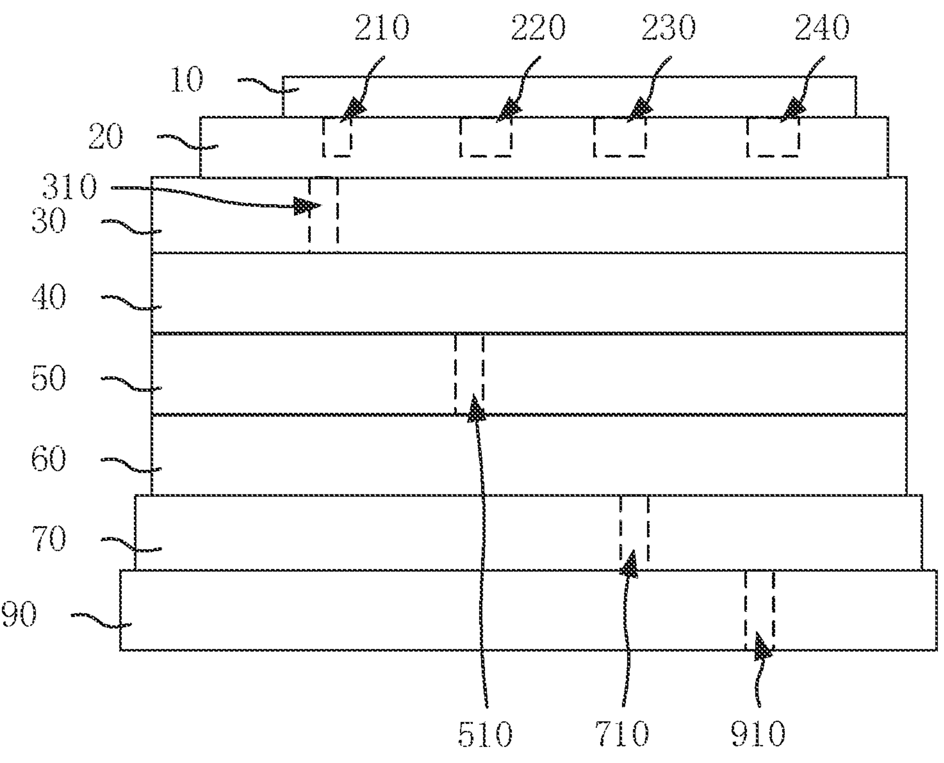
FIG. 3 is a second structural schematic diagram of the display panel provided by one embodiment of the present application.
Figure 4:
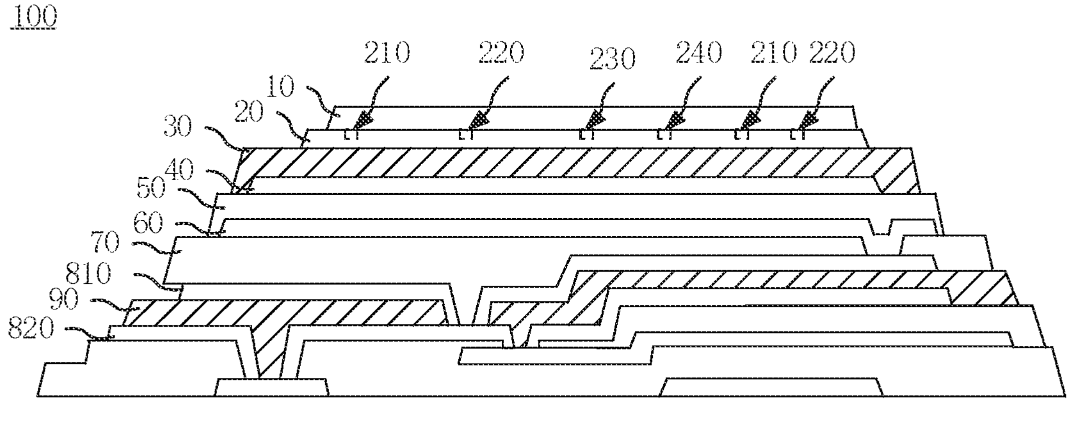
FIG. 4 is a third structural schematic diagram of the display panel provided by one embodiment of the present application.

Please continue referring to FIG. 3 and FIG. 4. FIG. 3 is a second structural schematic diagram of the display panel provided by one embodiment of the present application. FIG. 4 is a third structural schematic diagram of the display panel provided by one embodiment of the present application. The display panel 100 includes a second planarization layer 50 and a second ITO layer 40. Wherein, the second planarization layer 50 is disposed on a side of the first planarization layer 30 away from the first ITO layer 20, and the second ITO layer 40 is disposed on a side of the second planarization layer 50 close to the first ITO layer 20.

Wherein, in order to further remedy the unevenness situation due to the via hole, a second via hole 510 is defined in the second planarization layer 50, and a second groove is defined in the first ITO layer 20 to make a part of the anode 10 be disposed in the second groove 220. Furthermore, a projection of the second groove 220 on the substrate 110 at least partially overlaps with a projection of the second via hole 510 on the substrate 110. By defining the second groove 220 in the first ITO layer 20 to make the anode 10 can be partially disposed in the second groove 220, the situation of the protruding anode 10 is relieved. Furthermore, as the projections of the second groove 220 and the second via hole 510 on the substrate 110 are at least partially overlapped, the situation that the anode 10 protrudes due to the second via hole 510 is better relieved, and the problem of the anode 10 being fractured during the manufacturing process is also solved.

The display panel 100 further includes a third planarization layer 70 and a third ITO layer 60. The third ITO layer 60 is disposed on a side of the third planarization layer 70 close to the first ITO layer 20. The third planarization layer 70 is disposed on a side of the second planarization layer 50 away from the first ITO layer 20. In order to further remedy the unevenness situation due to the via hole, a third via hole 710 is defined in the third planarization layer 70, and a third groove 230 is defined in the first ITO layer 20 to make a part of the anode 10 be disposed in the third groove 230. Furthermore, a projection of the third groove 230 on the substrate 110 at least partially overlaps with a projection of the third via hole 710 on the substrate 110. By defining the third groove 230 in the first ITO layer 20 to make the anode 10 can be partially disposed in the third groove 230, which relieves the situation of the protruding anode 10. Furthermore, as the projections of the third groove 230 and the third via hole 710 on the substrate 110 are at least partially overlapped, the situation that the anode 10 protrudes due to the third via hole 710 is better relieved, and the problem of the anode 10 being fractured during the manufacturing process is also solved.

The display panel 100 further includes a fourth planarization layer 90. The fourth planarization layer 90 is disposed on a side of the fourth planarization layer 70 away from the first ITO layer 20. A fourth via hole 910 is defined in the fourth planarization layer 90. In order to further remedy the unevenness situation due to the via hole, a fourth groove 240 is defined in the first ITO layer to make a part of the anode 10 be disposed in the fourth groove 240. Furthermore, a projection of the fourth groove 240 on the substrate 110 at least partially overlaps with a projection of the fourth via hole 910 on the substrate 110. By defining the fourth groove 240 in the first ITO layer 20 to make the anode 10 can be partially disposed in the fourth groove 240, the situation of the protruding anode 10 is relieved. Furthermore, as the projections of the fourth groove 240 and the fourth via hole 910 on the substrate 110 are at least partially overlapped, the situation that the anode 10 protrudes due to the fourth via hole 910 is better relieved, and the problem of the anode 10 being fractured during the manufacturing process is also solved.

Wherein, a groove depth of the first groove 210, a groove depth of the second groove 220, a groove depth of a third groove 230, and a groove depth of the fourth groove 240 can be equal and can all be not equal. The specific can be configured according to actual situations. Exemplarily, in some embodiments, the groove depth of the first groove 210, the groove depth of the second groove 220, the groove depth of the third groove 230, and the groove depth of the fourth groove 240 are all equal. Therefore, the first groove 210, the second groove 220, the third groove 230, and the fourth groove 240 can be conveniently manufactured at a same time, so as to simplify the process flow and save the cost. In some embodiments, the groove depth of the first groove 210, the groove depth of the second groove 220, the groove depth of the third groove 230, and the groove depth of the fourth groove 240 can be not equal, which can be designed according to a size of the first via hole 310, a size of the second via hole 510, a size of the third via hole 710, and a size of the fourth via hole 910, so as to precisely eliminate the protrusion of the anode 10 and prevent the problem of fracture generating in the anode 10 and the first ITO layer 20.

It should be noted that the groove depth of the second groove 220, the groove depth of the third groove 230, and the groove depth of the fourth groove 240 are all less than a thickness of the first ITO layer 20, i.e., the second groove 220, the third groove 230, the fourth groove 240 are all blind holes, so as to prevent the anode 10 from being connected to the first planarization layer 30 through the first groove 210, the second groove 220, the third groove 230, or the fourth groove 240.

It can be understood that the first groove 210, the second groove 220, the third groove 230, and the fourth groove 240 do not overlap with each other, because the first groove 210, the second groove 220, the third groove 230, and the fourth groove 240 are respectively defined at different positions of the first ITO layer 20. That is, the first ITO layer 20 has a first portion for defining the first groove 210, a second portion for defining the second groove 220, a third portion for defining the third groove 230, and a fourth portion for defining the fourth groove 240. Wherein, the first portion, the second portion, the third portion, and the fourth portion are spaced apart from each other. Therefore, although the positions of the first groove 210, the second groove 220, the third groove 230, and the fourth groove 240 correspond to the first via hole 310, the second via hole 510, the third via hole 710, and the fourth via hole 910; even if the projections of the first via hole 310, the second via hole 510, the third via hole 710, and the fourth via hole 910 are respectively overlapped on the substrate 110; on the first ITO layer, the groove will only appear in the place corresponding to the via hole, and no groove will appear in other places. Therefore, when the projections of the first via hole 310, the second via hole 510, the third via hole 710, and the fourth via hole 910 are respectively overlapped or not overlapped on the substrate 110; the first groove 210, the second groove 220, the third groove 230, and the fourth groove 240 are all not overlapped.

It should be noted that the first groove 210, the second groove 220, the third groove 230, and the fourth groove 240 are all disposed below the first ITO layer 20 corresponding to the small tail 120 of the anode 10. By defining the first groove 210, the second groove 220, the third groove 230, and the fourth groove 240 at these positions, the protrusion of the anode 10 incurred by the unevenness of the via holes can be eliminated, thereby preventing the situation of the first ITO layer 20 and the anode 10 being fractured due to the uneven stress distribution incurred by the impact force during the cleaning process.

It should be noted that, the depth of the first via hole 310, the depth of the second via hole 510, the depth of the third via hole 710, and the depth of the fourth via hole 910 can be equal or not equal. Specifically, the depth of the first via hole 310 is related to the thickness of the first planarization layer 30, the depth of the second via hole 510 is related to the thickness of the second planarization layer 50, the depth of the third via hole 710 is related to the thickness of the third planarization layer 70, and the depth of the fourth via hole 910 is related to the thickness of the fourth planarization layer 90. Therefore, the depth of the first via hole 310, the depth of the second via hole 510, the depth of the third via hole 710, and the depth of the fourth via hole 910 can be specifically configured according to actual situations, which are not specifically limited herein.

The display panel 100 further includes a first metal layer 820 and a second metal layer 810. The first metal layer 820 is disposed on a side of the fourth planarization layer 90 away from the third planarization layer 70. The second metal layer 810 is disposed between the fourth planarization layer 90 and the third planarization layer 70.

The display panel 100 further includes a driving transistor. A side of a part of a region of the anode 10 covers on the driving transistor to reduce parasitic capacitor formed from the anode 10 and the driving transistor.

Figure 5:
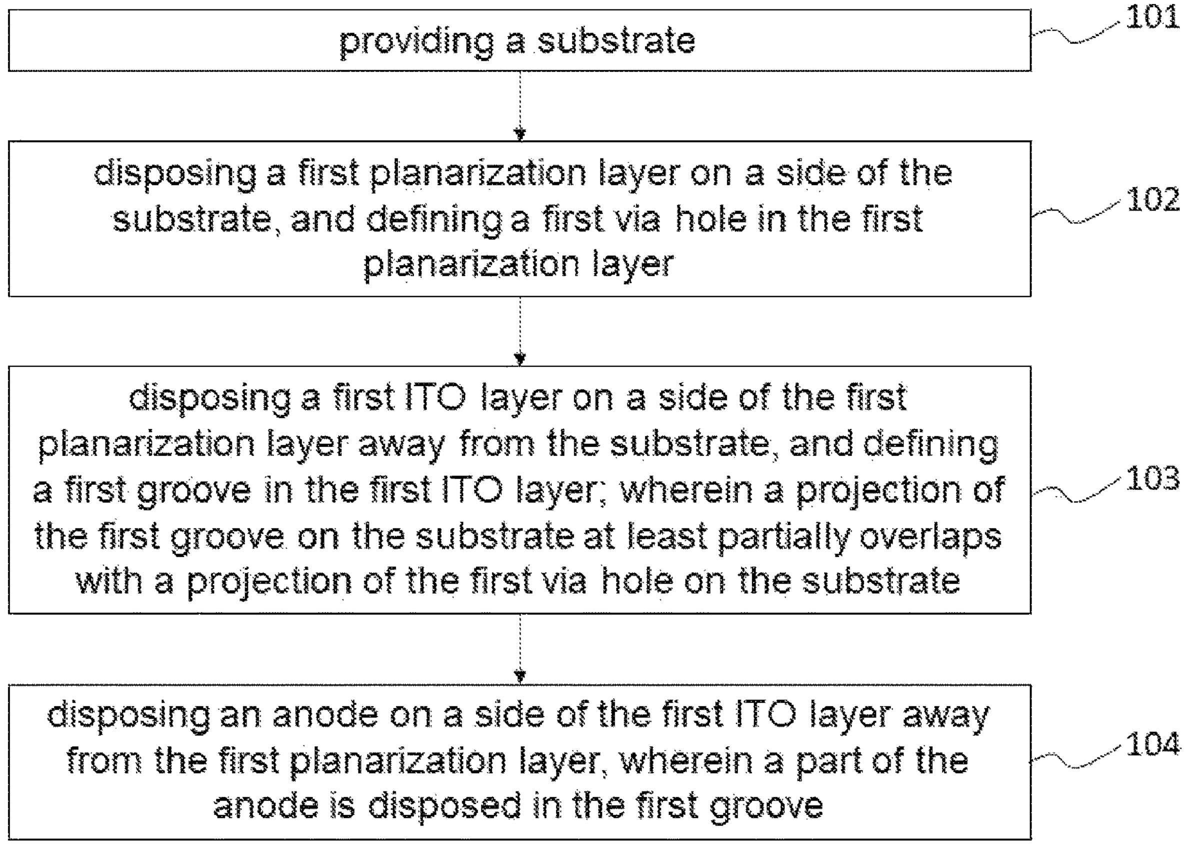
FIG. 5 is a flowchart of a manufacturing method of the display panel provided by one embodiment of the present application.

In the embodiments of the present application, by disposing the first groove 210, the second groove 220, the third groove 230, and the fourth groove 240 in the first ITO layer 20 provided with the anode 10; the anode 10 can be made to partially dispose in the first groove 210, the second groove 220, the third groove 230, and the fourth groove 240, so as to remedy the protrusion situation of the anode 10. In addition, as the projection of the first via hole 310 on the substrate 110 partially overlaps with the projection of the first groove 210 on the substrate 110, the projection of the second via hole 510 on the substrate 110 partially overlaps with the projection of the second groove 220 on the substrate 110, the projection of the third via hole 710 on the substrate 110 partially overlaps with the projection of the third groove 230 on the substrate 110, and the projection of the fourth via hole 910 on the substrate 110 partially overlaps with the projection of the fourth groove 240 on the substrate 110; the protrusion of the anode 10 caused by the unevenness of the via hole can be further eliminated, thereby preventing the first ITO layer 20 and the anode 10 from being fractured due to uneven stress distribution incurred by the impact force during the cleaning process. Please continue referring to FIG. 5. FIG. 5 is a flowchart of a manufacturing method of the display panel provided by one embodiment of the present application. One embodiment of the present application further provides a manufacturing method of the display panel. By using the manufacturing method, the display panel mentioned in any one of the above can be obtained. Specific processes of the manufacturing method are as follows.

101: providing a substrate.

The substrate can be a flexible substrate, and can also be a glass substrate. The specific is configured according to actual situations, which is not specifically limited herein.

102: disposing a first planarization layer on a side of the substrate, and defining a first via hole in the first planarization layer.

In other embodiment, before defining the first via hole in the first planarization layer, the following steps are further included.

Firstly, disposing a first metal layer on a side of the substrate.

Then, disposing a fourth planarization layer on a side of the first metal layer away from the substrate, and defining a fourth via hole on the fourth planarization layer.

Then, disposing a second metal layer on a side of the fourth planarization layer away from the substrate.

Then, disposing a third planarization layer on a side of the second metal layer away from the substrate, and defining a third via hole in the third planarization layer.

Then, disposing a third ITO layer on a side of the third planarization layer away from the substrate.

Then, disposing a second planarization layer on a side of the third ITO layer away from the substrate, and defining a second via hole in the second planarization layer.

Then, disposing a second ITO layer on a side of the second planarization layer away from the substrate.

Then, disposing a first planarization layer on a side of the second ITO layer away from the substrate, and defining a first via hole in the first planarization layer.

Wherein, structural sizes and relations of the first via hole, the second via hole, the third via hole, and the fourth via hole can refer the above, and redundant description will not be mentioned herein again.

103: disposing a first ITO layer on a side of the first planarization layer away from the substrate, and defining a first groove in the first ITO layer; wherein a projection of the first groove on the substrate at least partially overlaps with a projection of the first via hole on the substrate.

It can be understood that in some other embodiments, a second groove corresponding to the second via hole, a third groove corresponding to the third via hole, or a fourth groove corresponding to the fourth via hole are further disposed in the first planarization layer. The specific configuration can refer to the above, and redundant description will not be mentioned herein again.

104: disposing an anode on a side of the first ITO layer away from the first planarization layer, wherein a part of the anode is disposed in the first groove.

By defining the first groove in the first ITO layer under the anode, and the orthographic projection of the first groove and the orthographic projection of the first via hole are at least partially overlapped, so that a part of the anode can be disposed in the first groove. Therefore, unevenness caused by the first via hole can be remedied, and the first ITO layer 20 and the anode 10 being fractured due to the situation of the uneven stress distribution incurred by the impact force during the cleaning process can be prevented. In addition, in order to further remedy this situation, the second groove corresponding to the second via hole, the third groove corresponding to the third via hole, or the fourth groove corresponding to the fourth via hole can also be formed in the first ITO layer to make display effect of the display panel display be better.

The display panel provided by the embodiments of the present application is described in detail above. The principle and implementation manner of present application are described herein with reference to specific embodiments. The foregoing descriptions of the embodiments are merely used for better understanding of the present application. Meanwhile, for a person of ordinary skill in the art can make variations and modifications to the specific implementation manner and application scope according to the idea of this application. In summary, contents of the specification shall not be construed as a limitation to this application.

What is claimed is:

1. A display panel, wherein the display panel comprises:

a substrate;

a first planarization layer, wherein the first planarization layer is disposed on a side of the substrate, and a first via hole is defined in the first planarization layer;

a first indium tin oxide (ITO) layer, wherein the first ITO layer is disposed on a side of the first planarization layer away from the substrate;

an anode, wherein the anode is disposed on a side of the first ITO layer away from the first planarization layer; and wherein a first groove is defined in the first ITO layer to make a part of the anode be disposed in the first groove, and a projection of the first groove on the substrate at least partially overlaps with a projection of the first via hole on the substrate.

2. The display panel as claimed in claim 1, wherein a projection area of the first groove on the substrate is greater than a projection area of the first via hole on the substrate.

3. The display panel as claimed in claim 2, wherein a groove depth of the first groove is less than a thickness of the first ITO layer.

4. The display panel as claimed in claim 1, wherein the display panel comprises a plurality of pixels and a driving transistor, the plurality of pixels are disposed on a side of the anode away from the first planarization layer, the anode comprises sub-anodes of smallest sub-pixels in each of the plurality of pixels, the sub-anodes comprise a main body portion and a connection portion, an orthogonal projection of the main body portion on the substrate is located in an orthogonal projection of the driving transistor on the substrate, the orthogonal projection of the driving transistor on the substrate is partially located out of an orthogonal projection of the connection portion on the substrate, and the first groove is defined at a position where the first ITO layer corresponds to the connection portion.

5. The display panel as claimed in claim 4, wherein the display panel comprises a second planarization layer, the second planarization layer is disposed on a side of the first planarization layer away from the first ITO layer, a second via hole is defined in the second planarization layer, a second groove is defined in the first ITO layer to make a part of the anode be disposed in the second groove, and a projection of the second groove on the substrate at least partially overlaps with a projection of the second via hole on the substrate.

6. The display panel as claimed in claim 5, wherein the display panel comprises a third planarization layer, the third planarization layer is disposed on a side of the second planarization layer away from the first ITO layer, a third via hole is defined in the third planarization layer, a third groove is defined in the first ITO layer to make a part of the anode be disposed in the third groove, and a projection of the third groove on the substrate at least partially overlaps with a projection of the third via hole on the substrate.

7. The display panel as claimed in claim 6, wherein the display panel comprises a fourth planarization layer, the fourth planarization layer is disposed on a side of the third planarization layer away from the first ITO layer, a fourth via hole is defined in the fourth planarization layer, a fourth groove is defined in the first ITO layer to make a part of the anode be disposed in the fourth groove, and a projection of the fourth groove on the substrate at least partially overlaps with a projection of the fourth via hole on the substrate.

8. The display panel as claimed in claim 7, wherein the first groove, the second groove, the third groove, and the fourth groove do not overlap with each other.

9. The display panel as claimed in claim 7, wherein a groove depth of the first groove, a groove depth of the second groove, a groove depth of the third groove, and a groove depth of the fourth groove are all equal.

10. The display panel as claimed in claim 7, wherein the display panel comprises a first metal layer and a second metal layer, the first metal layer is disposed on a side of the fourth planarization layer away from the third planarization layer, and the second metal layer is disposed between the fourth planarization layer and the third planarization layer.

11. The display panel as claimed in claim 7, wherein the display panel comprises:

a second ITO layer, wherein the second ITO layer is disposed on a side of the second planarization layer close to the first ITO layer;

a third ITO layer, wherein the third ITO layer is disposed on a side of the third planarization layer close to the first ITO layer.

12. The display panel as claimed in claim 7, wherein a groove depth of the second groove, a groove depth of the third groove, and a groove depth of the fourth groove are less than a thickness of the first ITO layer.

13. The display panel as claimed in claim 7, wherein a groove depth of the first groove, a groove depth of the second groove, a groove depth of a third groove, and a groove depth of the fourth groove are not all equal.

14. The display panel as claimed in claim 7, wherein the projection of the first via hole on the substrate, the projection of the second via hole on the substrate, the projection of the third via hole on the substrate, and the projection of the fourth via hole on the substrate are partially overlapped.

15. The display panel as claimed in claim 7, wherein a depth of the first via hole, a depth of the second via hole, a depth of the third via hole, and a depth of the fourth via hole are equal.

16. The display panel as claimed in claim 7, wherein a depth of the first via hole, a depth of the second via hole, a depth of the third via hole, and a depth of the fourth via hole are not equal.

17. The display panel as claimed in claim 4, wherein the second groove, the third groove, and the fourth groove are defined at a position where the first ITO layer corresponds to the connection portion.

18. The display panel as claimed in claim 4, wherein a shape of the connection portion is a regular strip or a regular flake.

19. The display panel as claimed in claim 1, wherein the display panel has a camera under panel region and a normal display region, an ITO wiring and a planarization (PLN) layer is disposed in the camera under panel region, and the first ITO layer and the anode are disposed in the normal display region.

20. The display panel as claimed in claim 1, wherein a projection area of the first groove on the substrate completely overlaps with a projection area of the first via hole on the substrate.

* * * * *